US009164631B2

(12) United States Patent
Wang et al.

(10) Patent No.: US 9,164,631 B2
(45) Date of Patent: Oct. 20, 2015

(54) CAPACITIVE TOUCH PANEL HAVING A PLURALITY OF SENSING UNITS CONNECTED BY BRIDGE WIRES

(71) Applicant: HengHao Technology Co. LTD, Taoyuan County (TW)

(72) Inventors: Ming-Hsi Wang, New Taipei (TW); Yu-Jen Chen, Pingtung County (TW)

(73) Assignee: HENGHAO TECHNOLOGY CO., LTD., Hsinchu Industrial Park, Hukou Township, Hsinchu County (TW)

( * ) Notice: Subject to any disclaimer, the term of this patent is extended or adjusted under 35 U.S.C. 154(b) by 126 days.

(21) Appl. No.: 13/656,695

(22) Filed: Oct. 20, 2012

(65) Prior Publication Data

US 2013/0100073 A1 Apr. 25, 2013

Related U.S. Application Data

(60) Provisional application No. 61/549,773, filed on Oct. 21, 2011.

(30) Foreign Application Priority Data

Nov. 25, 2011 (TW) .............................. 100222410 U

(51) Int. Cl.
*G06F 3/041* (2006.01)
*G06F 3/044* (2006.01)

(52) U.S. Cl.
CPC ...... *G06F 3/044* (2013.01); *G06F 2203/04111* (2013.01)

(58) Field of Classification Search
CPC .......... G06F 3/044; G06F 2203/04107; G06F 2203/04111
USPC ........................................................ 345/173
See application file for complete search history.

(56) References Cited

U.S. PATENT DOCUMENTS

| | | | |
|---|---|---|---|
| 2002/0190643 A1* | 12/2002 | Cummings et al. ........... | 313/553 |
| 2009/0085885 A1* | 4/2009 | Wu et al. ........................ | 345/173 |
| 2010/0134448 A1* | 6/2010 | Park et al. ..................... | 345/176 |
| 2010/0277443 A1* | 11/2010 | Yamazaki et al. ............. | 345/204 |
| 2011/0074730 A1* | 3/2011 | Nagata et al. ................. | 345/174 |
| 2012/0169647 A1* | 7/2012 | Kuo ............................... | 345/174 |
| 2012/0186966 A1* | 7/2012 | Chang et al. .................. | 200/600 |
| 2012/0235927 A1* | 9/2012 | Ho et al. ........................ | 345/173 |

* cited by examiner

*Primary Examiner* — Long D Pham
(74) *Attorney, Agent, or Firm* — Winston Hsu; Scott Margo

(57) ABSTRACT

A capacitive touch panel and a touch display panel using the same are provided. The capacitive touch panel includes a substrate, a plurality of sensing structures and a light diffusing structure. Each sensing structure includes a plurality of sensing units and a plurality of bridge wires, and two adjacent sensing units are connected by a corresponding bridge wire. The light diffusing structure is formed on at least one of the bridge wires. After a light is incident to the light diffusing structure, the light is diffusely reflected.

7 Claims, 5 Drawing Sheets

CAPACITIVE TOUCH PANEL HAVING A PLURALITY OF SENSING UNITS CONNECTED BY BRIDGE WIRES

CROSS-REFERENCE TO RELATED APPLICATIONS

This application claims the benefit of U.S. Provisional Application No. 61/549,773, filed on Oct. 21, 2011 and entitled ANTI-REFLECTIVE STRUCTURE OF TOUCH SENSING ELEMENT, and claims priority to Taiwan Patent Application No. 100222410, filed on Nov. 25, 2011, the entire contents of both which are hereby incorporated by reference.

BACKGROUND OF THE INVENTION

1. Field of the Invention

The invention relates in general to a capacitive touch panel and a touch display panel using the same, and more particularly to a capacitive touch panel capable of reducing the reflection of the light and a touch display panel using the same.

2. Description of Related Art

In a conventional capacitive touch panel, each sensing structure includes a plurality of metal bridge wires and a plurality of sensing units, and a metal bridge wire connects two adjacent sensing units. Therefore, in each sensing structure, the metal bridge wires are electrically connected to the sensing units.

The bridge wires are directly formed on the substrate. The bridge wires are made from metal and form a metal structure which causes the light entering the metal bridge wires to generate strong reflection, which results in visual discomfort to the user.

SUMMARY OF THE INVENTION

The invention is directed to a capacitive touch panel and a touch display panel using the same capable of reducing reflectivity and improving display quality.

According to an embodiment of the present invention, a capacitive touch panel is provided. The capacitive touch panel includes a substrate, a plurality of sensing structures and a light diffusing structure. Each sensing structure includes a plurality of sensing units and a plurality of bridge wires, and two adjacent sensing units are connected by a corresponding bridge wire. The light diffusing structure is formed on at least one of the bridge wires. After a light is incident to light diffusing structure, the light is diffusely reflected.

According to another embodiment of the present invention, a touch display panel is provided. The touch display panel includes a capacitive touch panel and a display panel configured corresponding to the capacitive touch panel. The capacitive touch panel includes a substrate, a plurality of sensing structures and a light diffusing structure. Each sensing structure includes a plurality of sensing units and a plurality of bridge wires, and two adjacent sensing units are connected by a corresponding bridge wire. The light diffusing structure is formed on at least one of the bridge wires. After a light is incident to light diffusing structure, the light is diffusely reflected.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
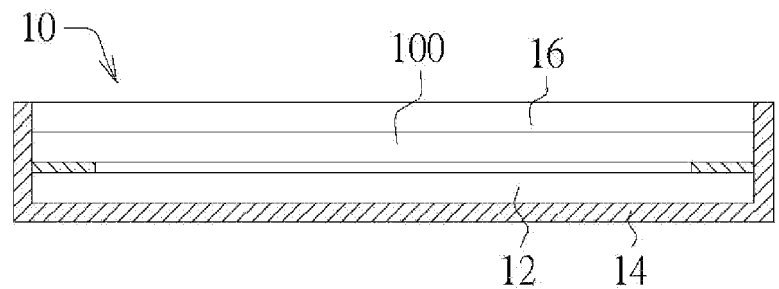
FIG. 1 shows a cross-sectional view of a touch display panel according to an embodiment of the invention.

Referring to FIG. 1, a cross-sectional view of a touch display panel according to an embodiment of the invention is shown. The touch display panel 10 is such as a hand-held electronic device, a notebook computer and a Tablet PC. The hand-held electronic device is such as a mobile, smart phone, a personal digital assistant (PDA) or a navigation device.

The touch display panel 10 includes a capacitive touch panel 100, display panel 12, a casing 14 and a transparent cover 16. The display panel 12 corresponds to the capacitive touch panel 100, and may be realized by any types of display panels such as a liquid crystal display panel, an electrophoretic display or an organic light-emitting diode (OLED) display.

The capacitive touch panel 100 and the display panel 12 are accommodated in the casing 14. The transparent cover 16 covers the capacitive touch panel 100.

Figure 2:
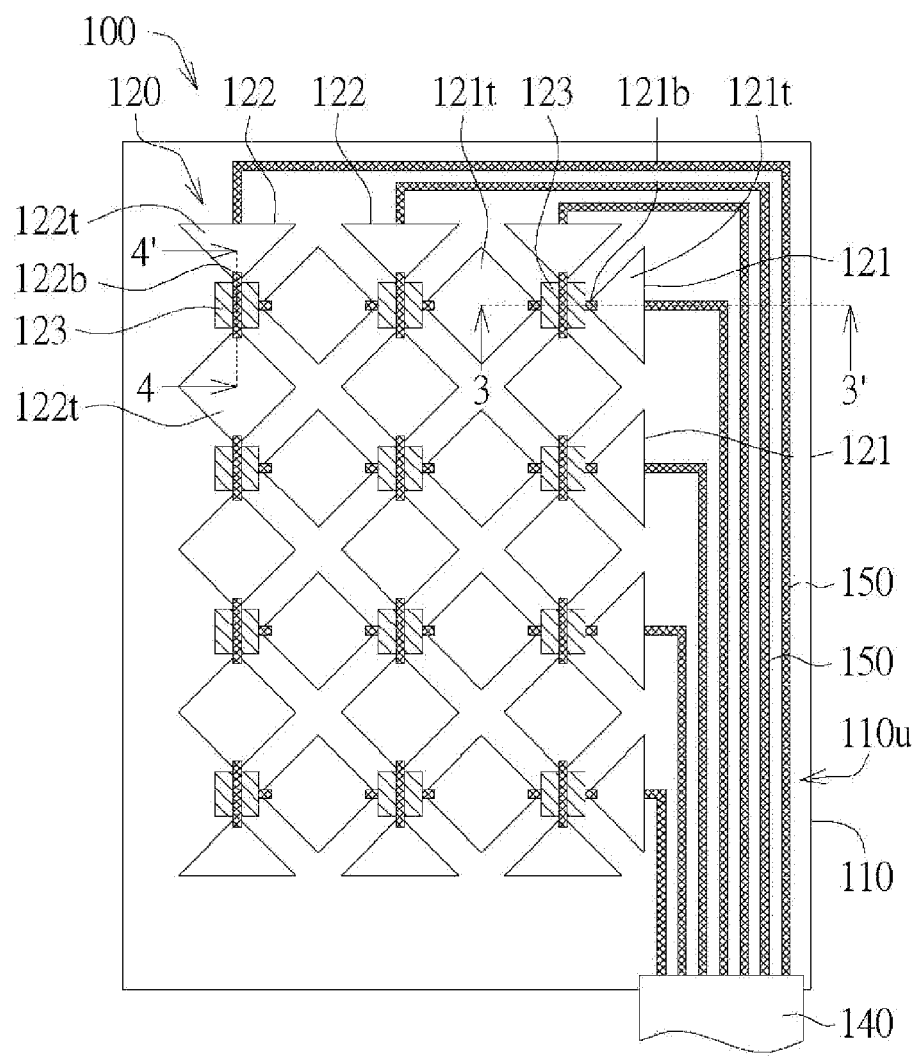
FIG. 2 shows a top view of the capacitive touch panel of FIG. 1.

Referring to FIG. 2, a top view of the capacitive touch panel of FIG. 1 is shown. The capacitive touch panel 100 includes a substrate 110, a plurality of sensing structures 120 and a light shading structures 130 (illustrated in FIG. 3). Moreover, the touch display panel 10 may be used in various electronic devices requiring the touch function.

Furthermore, the capacitive touch panel 100 includes at least one signal transmission wire 150 and a circuit board 140. The signal transmission wires 150 connect the sensing structures 120 and the circuit board 140, receive a touch signal outputted from the sensing structures 120, and transmit the received touch signal to the circuit board 140.

The substrate 110 is a transparent the substrate, made from a high transmittance insulating material, such as glass, polycarbonate (PC), polyethylene terephthalate (PET), polymethylmethacrylate (PMMA) or cyclic olefin copolymer.

In the present embodiment of the invention, the sensing structures 120 are formed on the upper surface 110$u$ of the substrate 110. In another embodiment of the invention, some of the sensing structures 120 are formed on the upper surface 110$u$ of the substrate 110, and the other sensing structures 120 are formed on a bottom surface of the substrate 110, which is opposite to the upper surface 110$u$.

Each sensing structure 120 includes a plurality of sensing units and a plurality of bridge wires, and two adjacent first sensing units are connected by a corresponding bridge wire. For example, in the present embodiment of the invention, the sensing structure 120 includes a plurality of first sensor rows 121 and a plurality of second sensor rows 122. Each first sensor row 121 is arranged along a first direction D1, and includes a plurality of first bridge wires and a plurality of first sensing units. Two adjacent first sensing units are connected by a corresponding first bridge wire. Each second sensor row 122 is arranged along a second direction D2, and includes a plurality of second bridge wires and a plurality of second sensing units. Two adjacent second sensing units are connected by a corresponding second bridge wire.

The sensing structure 120 further includes an insulation layer 123 electrically isolating the first bridge wires 121b from the second bridge wires 122b to avoid the first bridge wires 121b contacting the corresponding second bridge wire 122b and becoming short-circuited. In addition, the insulation layer 123 may be realized by an insulation layer either permeable or impermeable to the light.

Figure 3:
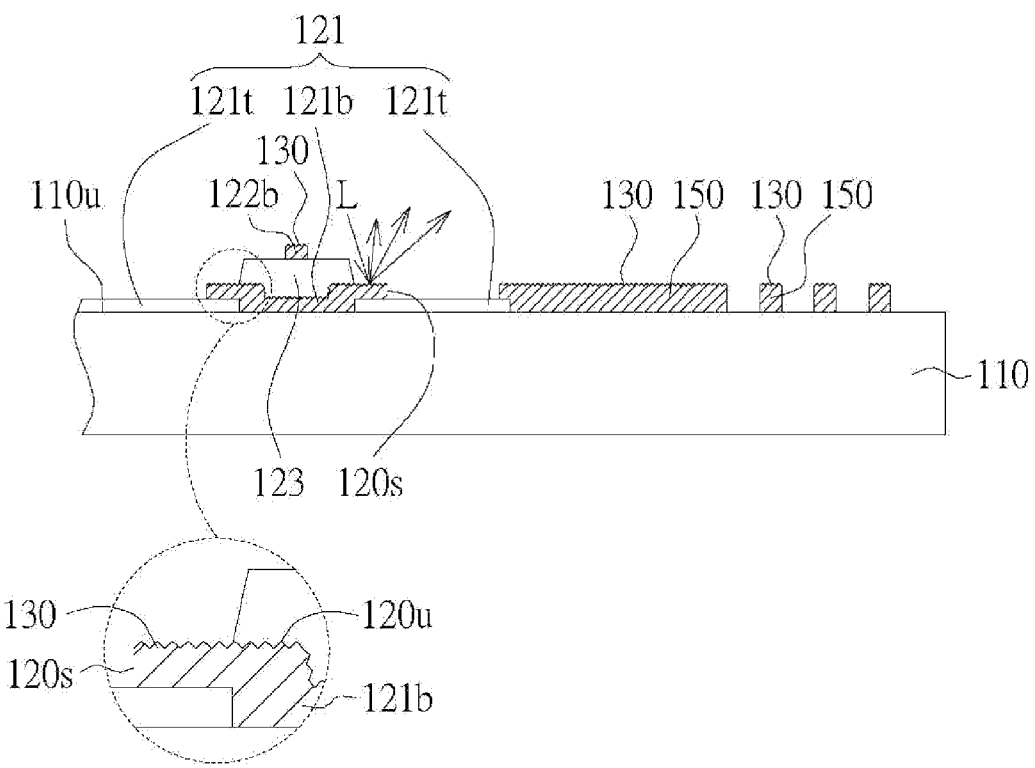
FIG. 3 shows a cross-sectional view along the direction 3-3' of FIG. 1.

Referring to FIG. 3, a cross-sectional view along the direction 3-3' of FIG. 1 is shown. In the present embodiment of the invention, the first sensor rows 121 and the insulation layer 123 are formed on the upper surface 110u of the substrate 110, and the second bridge wires 122b are formed on the insulation layer 123, crossing the insulation layer 123 to connect two adjacent second sensing units 122t.

In another embodiment of the invention, the structure of the sensing structures 120 may be different from the structure shown in FIG. 2. For example, the first sensor rows 121 and the second sensor rows 122 may be respectively formed on the opposite sides of the substrate 110. The structure of the sensing structure 120 may have several different designs according to the different requirements, and the structure of the sensing structure 120 is not limited by the present embodiment.

In the present embodiment of the invention, the first sensing units 121t are made from such as a transparent conductive oxide (TCO) or a transparent organic conductive material. The transparent conductive material is such as indium tin oxide (ITO) or indium zinc oxide (IZO), and the transparent organic conductive material is such as Poly (3,4-ethylenedioxythiophene) poly (styrenesulfonate) (PEDOT). The material of the second sensing unit 122t is similar to that of the first sensing unit 121t, and the similarities are not repeated here. The first bridge wires 121b are made from such as a transparent conductive material or a metal selected from a group consisting of titanium, aluminum, molybdenum, copper, silver and a combination thereof. The material of the second bridge wires 122b is similar to that of the first bridge wires 121b, and the similarities are not repeated here.

Furthermore, in another embodiment of the invention, the first bridge wires 121b include a first conductive layer 121b1, a second conductive layer 121b2 and a third conductive layer 121b3. The first conductive layer 121b1 is formed on the substrate 110, and the second conductive layer 121b2 is formed on the first conductive layer 121b1, and the third conductive layer 121b3 is formed on the second conductive layer 121b2. In another embodiment of the invention, the first conductive layer 121b1, the second conductive layer 121b2 and the third conductive layer 121b3 are respectively made of molybdenum/aluminum/molybdenum or titanium/aluminum/titanium. In In another embodiment of the invention, the thickness of the molybdenum layer is about 25 nanometers and the thickness of the aluminum layer is about 250 nanometers.

As shown in FIG. 3, the light diffusing structure 130 is formed on at least one of the bridge wires. After a light L is incident to the light diffusing structure 130, the light L is diffusely reflected, such as the diffused reflection or scattered reflection, so as to prevent the light L from reflecting concentratedly, wherein the light L is the ambient light such as the solar light or the external light source. In the present embodiment of the invention, the light diffusing structure 130 may be formed on the first bridge wires 121b, such as being formed on the upper surface 120u of the first bridge wires 121b. Consequently, after the light L incident to the light diffusing structure 130, the light L is diffusely reflected. In addition, the upper surface 120u is the upper surface of the third conductive layer 122b3, that is to say, the light diffusing structure 130 is formed on the third conductive layer 122b3. In another embodiment of the invention, the light diffusing structure 130 may be formed on the upper surface 120u and the side surface 120s of the first bridge wires 121b. In other embodiment of the invention, the light diffusing structure 130 may not be formed on the first bridge wires 121b.

As shown in FIG. 3, as the signal transmission wires 150 and the first bridge wires 121b or the second bridge wires 122b are formed in the same manufacturing processes, the upper surface of the signal transmission wires 150 (or the upper surface and the side surface) may also be formed on the light diffusing structure 130. In another embodiment of the invention, the light diffusing structure 130 may not be formed on the signal transmission wires 150.

Figure 4:
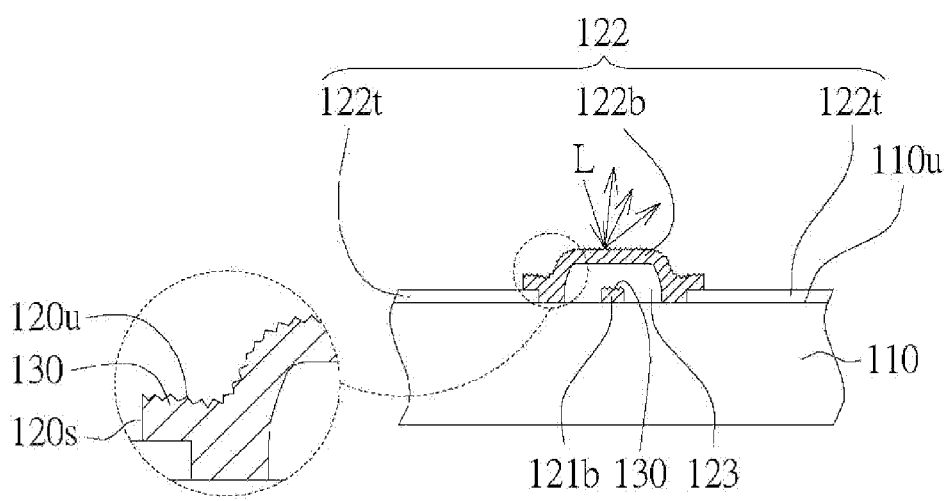
FIG. 4 shows a cross-sectional view along the direction 4-4' of FIG. 2.

Referring to FIG. 4, FIG. 4 shows a cross-sectional view along the direction 4-4' of FIG. 2. The second sensing unit 122t is formed on the upper surface 110u of the substrate 110. In one embodiment of the invention, the second bridge wires 122b may include a first conductive layer 122b1, a second conductive layer 122b2 and a third conductive layer 122b3. The first conductive layer 121b1 is formed on the insulation layer 123, and the second conductive layer 122b2 is formed on the first conductive layer 122b1, and the third conductive layer 122b3 is formed on the second conductive layer 122b2. The material and size of the first conductive layer 122b1, the second conductive layer 122b2 and the third conductive layer 122b3 may be similar to those of the first conductive layer 121b1, the second conductive layer 121b2 and the third conductive layer 121b3 described above, and the similarities are not repeated here.

As indicated in FIG. 4, the light diffusing structure 130 may be formed on the second bridge wires 122b, such as being formed on the upper surface 120u of the second bridge wires 122b. Therefore, after the light L is incident to the light diffusing structure 130, the light L is diffusely reflected. In addition, the upper surface 120u is the upper surface of the third conductive layer 122b3, that is to say, the light diffusing structure 130 is formed on the third conductive layer 122b3. In another embodiment of the invention, the light diffusing structure 130 may be formed on the upper surface 120u and the side surface 120s of the first bridge wires 121b. In another embodiment of the invention, the light diffusing structure 130 may not be formed on the first bridge wires 121b.

The light diffusing structure 130 is such as a roughened structure, and therefore, after the light L is incident to the light diffusing structure 130, the light L is diffusely reflected. In another embodiment of the invention, the light diffusing structure may be taken in design of other structures so that the incident light L can be diffusely reflected. For example, the light diffusing structure 130 can be an oxidizing material or a pattern structure. Whether the light diffusing structure 130 is a roughened structure, an oxidizing material or a pattern structure, the light L can be diffusely reflected, after the light L is incident to the light diffusing structure 130.

In one method for forming the light diffusing structure 130 such as a roughened structure, wherein the first bridge wires 121b are taken as an example, the coating, the sputtering, the vapor phase deposition or evaporation method may be used to form the material of the bridge wires (not illustrated) on the substrate 110. The material of the bridge wires may be selected from a group consisting of titanium, aluminum, molybdenum, copper, silver and a combination thereof. Then, the chemical etching, the photolithography process, the roller pressing, the fluff brush or the steel wire brush, for example, is used to form the light diffusing structure 130 (such as the roughened structure) on the entire upper surface of the material of the bridge wires. Afterwards, the photolithography process, for example, is used to pattern the material of the bridge wires in order to form the first bridge wires 121b. In such manufacturing processes, the light diffusing structure 130 is formed only on the upper surface 120u of the bridge wires, that is to say, the side surface 120s of the bridge wires have no roughened structure. In one embodiment, the light diffusing structure 130 may be formed on the side surface 120s of the bridge wires. For example, after patterning the material of the bridge wires, the first bridge wires 121b is formed, wherein the side surface 120s of the first bridge wires 121b is exposed, and then the chemical etching, the photolithography process, the roller pressing, the fluff brush or the steel wire brush is used to form the light diffusing structure 130 on the upper surface 120u and the side surface 120s of the bridge wires. In addition, the similar method can be used to form the light diffusing structure 130 (roughened structure) on the second bridge wires 122b.

In another method for forming the light diffusing structure 130 such as the oxidizing material, wherein the first bridge wires 121b are taken as an example, the coating, the sputtering, the vapor phase deposition or evaporation method may be used to form the material of the bridge wires on the substrate 110 or the insulation layer 123. Then oxygen is used in the process of sputtering or depositing the metal. Then, after the process of sputtering or depositing, the ambient air is arranged to flow into the cavity for oxidizing the bridge wires; or the oxygen plasma treatment is performed process to form the metal oxide (the light diffusing structure) on the surface of the bridge wires, wherein the metal oxide is such as aluminum oxide (AlOx), molybdenum oxide (MoOx), titanium dioxide (TiOx), copper oxide (CuOx), or silver oxide (AgOx). Furthermore, in the forming process, the thickness of the metal oxide (the light diffusing structure), ranging from 10 nanometers to 100 nanometers, may be controlled by using the specific amount of oxygen or the ambient air in the cavity, or using the specific processing time and power of the oxygen plasma treatment. It is able to generate a light interference phenomena for reducing the reflection rate and the visual discrimination in the use of the film characteristic of the metal oxide. Then, the photolithography process, for example, is used to pattern the metal oxide and the material of the bridge wires, in order to form the first bridge wires 121b. In addition, the similar method can be used to form the light diffusing structure 130 (such as oxidizing material) on the second bridge wires 122b.

Figure 5A:
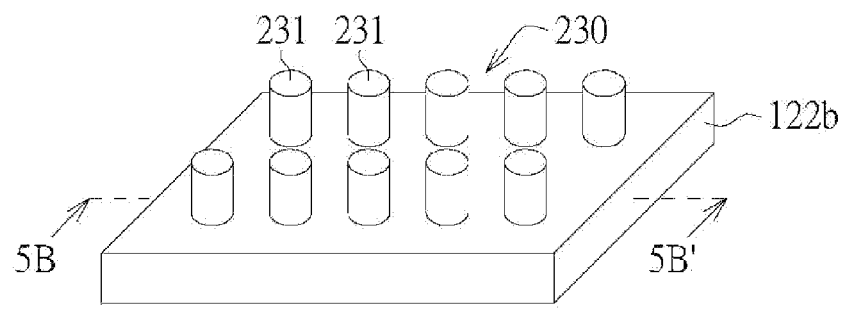
FIG. 5A shows a light diffusing structure according to another embodiment of the invention.
Figure 5B:
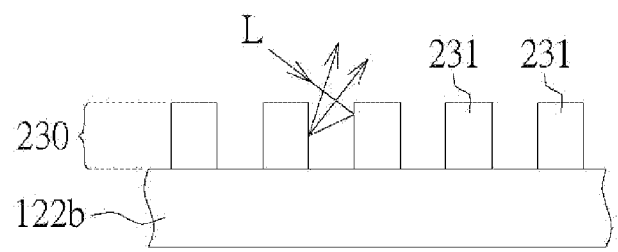
FIG. 5B shows a cross-sectional view along the direction 5B-5B' of FIG. 5A.

Referring to FIG. 5A and FIG. 5B, FIG. 5A shows a light diffusing structure, according to another embodiment of the invention. FIG. 5B shows a cross-sectional view along the direction 5B-5B' of FIG. 5A. The light diffusing structure 230, which is formed on the second bridge wires 122b, are taken as an example. The light diffusing structure 230 is a pattern structure, which includes a plurality of cylinders 231. After the light L is incident to the cylinders 231, the light L is diffusely reflected. The cross section of the cylinder is such as circular, elliptical or polygonal shape, wherein the polygonal shape is such as the triangular, rectangular or square shape. The cross sections of the cylinder 231 can be identical or not.

In one method for forming the light diffusing structure 230, wherein the light diffusing structure 230 formed on the second bridge wires 122b is taken as an example, the coating, the sputtering, the vapor phase deposition or evaporation method can be used to form a diffusing material on the second bridge wires 122b, wherein the diffusing material is such as the organic material or the inorganic material. The organic material may be selected from a group consisting of the red photoresist, the blue photoresist, the green photoresist, the transparent photoresist and the black photoresist. The inorganic material, for example, is metal oxide, silicon dioxide or silicon nitride, wherein the metal oxide is such as Nb2O5, ITO, AlOx, etc., and the silicon dioxide is such as SiOx, SiOxNy, etc., and the silicon nitride is such as SiNx or SiOxNy. Then, for example, the photolithography process may be used to pattern the diffusing material, in order to form the light diffusing structure 230 (pattern structure). In addition, the similar method may be used to form the light diffusing structure 230 on the first bridge wires 121b and for the signal transmission wires 150.

In the present embodiment of the invention, the light diffusing structure 230 may not have a roughened structure. In another embodiment of the invention, before patterning the diffusing material, the chemical etching, the photolithography process, the roller pressing, the fluff brush or the steel wire brush, for example, may be used to form the roughened structure of the light diffusing structure 130 on the entire upper surface of the diffusing material. In another embodiment of the invention, the light diffusing structure 230 may be similar to the oxidizing material mentioned above.

Figure 6A:
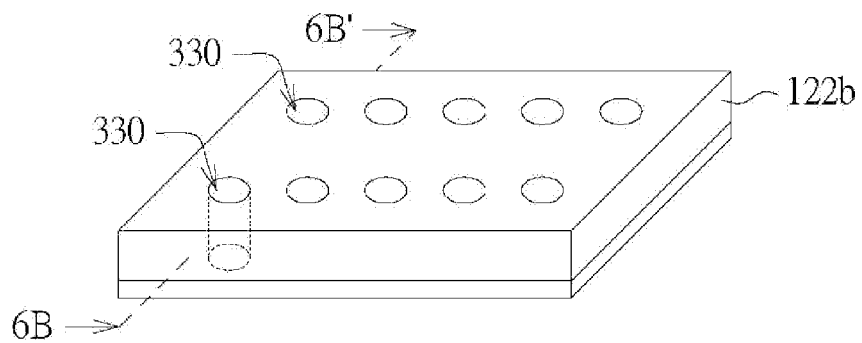
FIG. 6A shows a cross-sectional view of a light diffusing structure according to another embodiment of the invention.
Figure 6B:
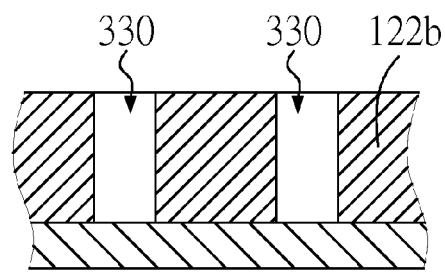
FIG. 6B shows a cross-sectional view along the direction 6B-6B' of FIG. 6A.

Referring to FIG. 6A and FIG. 6B, FIG. 6A shows a cross-sectional view of the light diffusing structure according to another embodiment of the invention, and FIG. 6B shows a cross-sectional view along the direction 6B-6B' of FIG. 6A. The light diffusing structure 330 formed on the second bridge wires 122b is taken as an example. The light diffusing structure 330 is a pattern slot, and after the light L is incident to the slot wall of the pattern slots, the light L is diffusely reflected. The similar light diffusing structure may be formed on the first bridge wires 121b, and the similarities are not repeated here.

Furthermore, the cross section of the light diffusing structure 330 is such as circular, elliptical or polygonal shape, wherein the polygonal shape is such as the triangular, rectangular or square shape.

Although the light diffusing structure disclosed in above embodiments, which has the roughened structure, the oxidizing material and the pattern structure, is formed by the additional processing or the surface treatment, the reflection rate can also be reduced by a proper designed thickness of the light diffusing structure.

Figure 7:
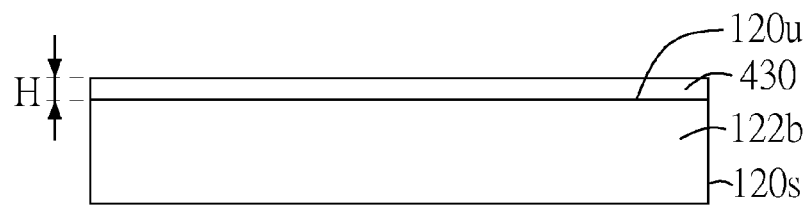
FIG. 7 shows a cross-sectional view of a light diffusing structure according to another embodiment of the invention.

Referring to FIG. 7, a cross sectional view of the light diffusing structure according to another embodiment of the invention is shown. The material of the light diffusing structure 430 is a colored organic material, wherein the colored organic material is, for example, at least one of the red photoresist, the blue photoresist, the green photoresist, the transparent photoresist and the black photoresist. The thickness H of the light diffusing structure 430 may range from about 0.5 micrometers to 2 micrometers, and the reflection rate may be reduced with a designed thickness of the light diffusing structure 430.

In the present embodiment of the invention, the light diffusing structure 430, which is formed on the upper surface 120u of the second bridge wires 122b, is taken as an example. However, in another embodiment of the invention, the light diffusing structure 430 is further formed on the side surface 120s of the second bridge wires 122b, so as to cover the second bridge wires 122b. In addition, the similar method can be used to form the light diffusing structure 430 on the first bridge wires 121b and/or the signal transmission wires 150.

Compared with the light diffusing structure in above embodiment, which has the roughened structure, the oxidizing material and the pattern structure, the light diffusing structure 430 in present embodiment is formed in a method other than the surface treatment or the surface machining, and then this doesn't limit the scope of the present invention. In one embodiment of the invention, although the figures are not illustrated, the light diffusing structure 430 may also have a roughened structure, which is similar to the light diffusing structure 130; or the light diffusing structure 430 may be an oxidizing material, which is similar to the oxidizing material mentioned above; or the light diffusing structure 430 is a pattern structure, which is similar to the light diffusing structure 330 mentioned above.

Figure 8:
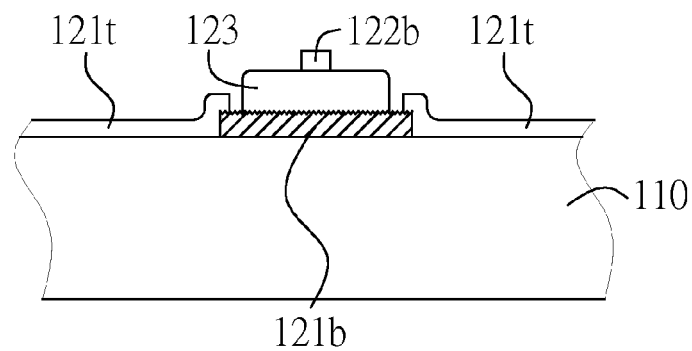
FIG. 8 shows a top view of the capacitive touch panel according to another embodiment of the invention.

FIG. 8 shows a top view of the capacitive touch panel according to another embodiment of the invention. In the present embodiment, firstly, the first bridge wires 121b are formed on the substrate 110. Next, the first sensing unit 121t is formed on the substrate 110, wherein two adjacent first sensing units 121t are connected by a corresponding first bridge wire 121b. Then, the insulation layer 123 is formed on the first bridge wires 121b. Afterwards, the second sensing units 122t and the second bridge wires 122b are formed. In the present embodiment, the second sensing units 122t and the second bridge wires 122b can be formed with the same material in the same manufacturing processes or in different manufacturing processes, such as the transparent conductive material or the transparent organic material; or, the second sensing units 122t and the second bridge wires 122b may also be formed with the different material in the same manufacturing processes or in different manufacturing processes.

Figure 9:
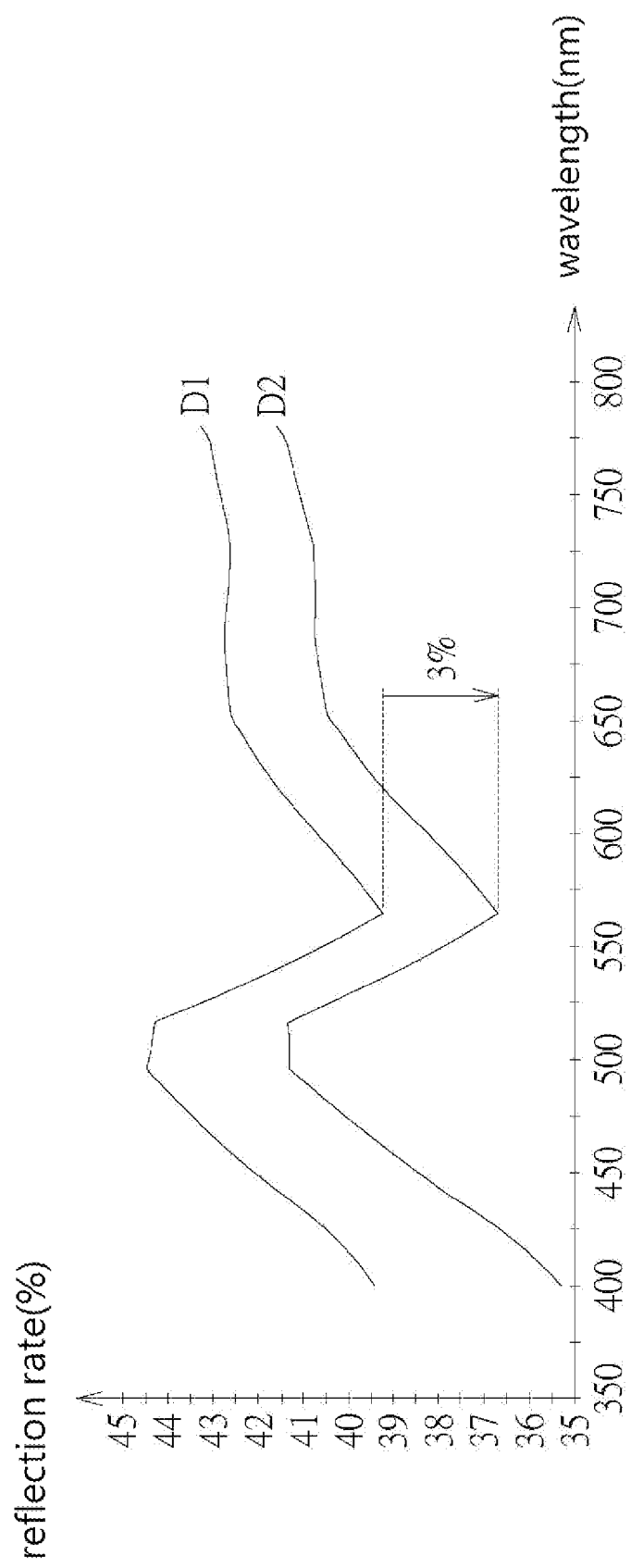
FIG. 9 shows the test result of the reflection rate of the light diffusing structure of an embodiment of the invention.

Referring to FIG. 9, FIG. 9 shows a test result of the reflection rate of the light diffusing structure in the present embodiment of the invention. For example, compared to the reflection rate (corresponding to the curve D1) in the conventional method without the light diffusing structure of the present embodiment, the refection rate of the capacitive touch panel 100 using the light diffusing structure 430 (corresponding to the curve D2) is lower by 3%. Therefore, the light diffusing structure 430 in the embodiment of the present invention has a great effect of reducing the reflection.

The capacitive touch panel and the touch display panel using the same, which are disclosed in above embodiments of the present invention, have a lot of features, and some features are described below:

(1). The light diffusing structure is a roughened structure, an oxidizing material or a pattern structure. Whether the light diffusing structure is a roughened structure, an oxidizing material or a pattern structure, the light may be diffusely reflected, after the light is incident to the light diffusing structure.

(2). The process for roughening the light diffusing structure can be realized by the chemical etching, the photolithography process, the roller pressing, the fluff brush or the steel wire brush.

(3). The diffusing material, for example, is the organic material or the inorganic material. The organic material is, for example, the photoresist material, such as any combination selected from a group consisting of the red photoresist, the blue photoresist, the green photoresist, the transparent photoresist and the black photoresist. The organic material is, for example, the metal oxide, silicon dioxide or silicon nitride, wherein the metal oxide is such as Nb2O5, ITO, AlOx, etc., and the silicon dioxide is such as SiOx, SiOxNy, etc., and the silicon nitride is such as SiNx or SiOxNy.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitive touch panel, comprising:
  a substrate;
  a plurality of sensing structures, wherein each sensing structure comprises a plurality of sensing units and a plurality of bridge wires, and two adjacent sensing units are connected by a corresponding bridge wire; and
  a light diffusing structure formed on at least one of the bridge wires, wherein after a light is incident to the light diffusing structure, the light is diffusely reflected, and wherein the light diffusing structure is a part of an upper surface of at least one of the bridge wires and a part of a side surface of at least one of the bridge wires,
  wherein the light diffusing structure is a roughened structure, and the light is diffusely reflected, after the light is incident to the roughened structure.

2. The capacitive touch panel according to claim 1, wherein the sensing structures comprise:
  a plurality of first sensor rows, each being arranged along a first direction and comprising:
    a plurality of first bridge wires; and
    a plurality of first sensing unit, two adjacent first sensing units being connected by a corresponding first bridge wire; and
  a plurality of second sensor rows, each being arranged along a second direction and comprising:
    a plurality of second bridge wires; and
    a plurality of second sensing units, two adjacent second sensing units being connected by a corresponding second bridge wire.

3. The capacitive touch panel according to claim 2, wherein the substrate has an upper surface and a bottom surface opposite to the upper surface, and the first sensor rows are formed on one of the upper surface and the bottom surface of the substrate, and the second sensor rows are formed on the other of the upper surface and the bottom surface.

4. The capacitive touch panel according to claim 1, wherein the light diffusing structure is a pattern structure.

5. A touch display panel, comprising:
  a capacitive touch panel, comprising:
    a substrate;
    a plurality of sensing structures, wherein each sensing structure comprises a plurality of sensing units and a plurality of bridge wires, and two adjacent sensing units are connected by a corresponding bridge wire; and
    a light diffusing structure formed on at least one of the bridge wires, wherein after a light is incident to the light diffusing structure, the light is diffusely reflected, and wherein the light diffusing structure is a part of an upper surface of at least one of the bridge wires and a part of a side surface of at least one of the bridge wires; and a display panel configured corresponding to the capacitive touch panel, wherein the light diffusing structure is a roughened structure, and the light is diffusely reflected, after the light is incident to the roughened structure.

6. The touch display panel according to claim 5, wherein the sensing structures comprising: a plurality of first sensor rows, each being arranged along a first direction and comprising: a plurality of first bridge wires; and a plurality of first sensing unit, two adjacent first sensing units being connected by a corresponding first bridge wire; and a plurality of second sensor rows, each being arranged along a second direction and comprising: a plurality of second bridge wires; and a plurality of second sensing units, two adjacent second sensing units being connected by a corresponding second bridge wire.

7. The touch display panel according to claim 5, wherein the light diffusing structure is a pattern structure.

* * * * *